US007660566B2

(12) United States Patent
Kuo et al.

(10) Patent No.: US 7,660,566 B2
(45) Date of Patent: Feb. 9, 2010

(54) SYSTEM FOR CREATING A PROGRAMMABLE TUNING VOLTAGE

(75) Inventors: Yao H. Kuo, West Bloomfield, MI (US); Thomas Wharam, Manchester, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 546 days.

(21) Appl. No.: 11/540,269

(22) Filed: Sep. 29, 2006

(65) Prior Publication Data
US 2008/0081589 A1 Apr. 3, 2008

(51) Int. Cl.
*H04B 1/18* (2006.01)
*H04B 1/16* (2006.01)
(52) U.S. Cl. ............... 455/150.1; 455/169.1; 455/195.1
(58) Field of Classification Search .......... 455/130, 455/150.1, 161.3, 195.1, 197.2, 169.1, 169.2, 455/313, 77, 154.1
See application file for complete search history.

(56) References Cited

U.S. PATENT DOCUMENTS

| 4,011,515 | A | * | 3/1977 | Hanson ................ 455/169.2 |
| 4,061,981 | A | | 12/1977 | Endres et al. |
| 4,361,907 | A | | 11/1982 | Wine |
| 4,472,685 | A | | 9/1984 | Dutasta |
| 4,590,611 | A | | 5/1986 | Maier et al. |
| 4,641,101 | A | | 2/1987 | Selim |
| 4,685,150 | A | | 8/1987 | Maier |
| 5,175,884 | A | | 12/1992 | Suarez |
| 5,179,726 | A | | 1/1993 | Moon |
| 5,510,859 | A | * | 4/1996 | Douglass et al. ............ 348/731 |
| 5,625,316 | A | | 4/1997 | Chambers et al. |
| 5,678,211 | A | | 10/1997 | Badger |
| 5,745,844 | A | * | 4/1998 | Kromer et al. .......... 455/193.1 |
| 5,752,179 | A | | 5/1998 | Dobrovolny |
| 5,822,687 | A | | 10/1998 | Bickley et al. |
| 6,021,322 | A | | 2/2000 | Hatada et al. |
| 6,023,198 | A | | 2/2000 | McKinney et al. |
| 6,496,075 | B2 | | 12/2002 | Justice et al. |
| 6,728,651 | B1 | | 4/2004 | Alton et al. |
| 6,957,053 | B1 | | 10/2005 | Moers |
| 7,236,741 | B2 | * | 6/2007 | Palermo et al. ............ 455/41.1 |
| 2004/0116091 | A1 | | 6/2004 | McGinn |
| 2004/0127181 | A1 | | 7/2004 | Galan |
| 2005/0104765 | A1 | | 5/2005 | Bandhauer |
| 2005/0134344 | A1 | | 6/2005 | Ro |
| 2006/0084396 | A1 | | 4/2006 | Matthew et al. |

FOREIGN PATENT DOCUMENTS

JP 05083151 4/1993

\* cited by examiner

*Primary Examiner*—Sonny Trinh
(74) *Attorney, Agent, or Firm*—Brinks Hofer Gilson & Lione

(57) ABSTRACT

A system for generating a tuning voltage including a processor, a tank circuit, and a feedback loop. The processor creates a tuning voltage that is provided to the tank circuit. A feedback loop optimizes tuning performance by adjusting the tuning voltage based on radio signal strength.

17 Claims, 4 Drawing Sheets

SYSTEM FOR CREATING A PROGRAMMABLE TUNING VOLTAGE

BACKGROUND

1. Field of the Invention

The present invention generally relates to a system for creating a tuning voltage for a receiver.

2. Description of Related Art

Typically, electronic receivers require tuning voltages to be provided to radio frequency (RF) tuning filters that track the tuning frequencies of an input signal. However, most radio microprocessors do not have a programmable tuning voltage generator. To create tuning voltages, many radios use complex circuits in addition to the microprocessor. For example, one common implementation utilizes two operational amplifiers, four transistors, and a number of resistors in communication with four control lines of the radio microprocessor. This implementation creates a voltage divider circuit to generate the tuning voltage for frequency tracking. Even if complex circuits are used, many times poor frequency tracking results, thereby compromising receiver performance.

In view of the above, it is apparent that there exists a need for an improved system for creating a tuning voltage.

SUMMARY

In satisfying the above need, as well as overcoming the enumerated drawbacks and other limitations of the related art, the present invention provides an improved system for creating a tuning voltage.

The system generally includes a processor, a tank circuit, and a feedback loop. The processor creates a tuning voltage that is provided to the tank circuit. The feedback loop is provided to optimize tuning performance by adjusting the tuning voltage based on radio signal strength. Accordingly, the processor includes an analog to digital converter that receives a strength signal indicative of radio signal strength. The processor reads the analog to digital converter and determines if the current value of the strength signal equals the desired voltage for the selected frequency. The processor may generate a lookup table based on calibration data for the tuner that identifies the desired voltage for the tuner at the selected frequency. If the current value is equal to the desired voltage, the value is saved and is used to generate a tuning voltage. Alternatively, if the current value is not equal to the desired voltage, the tuning voltage is changed accordingly and monitored by the feedback loop until the desired voltage is attained.

Due to manufacturing inconsistency, tuners inherently have different optimal tuning voltages at each frequency. Accordingly, a tuning voltage for a certain frequency on one tuner may produce a different result than the same tuning voltage provided to another tuner at the same frequency. These inherent inconsistencies cause tuner variation that may result in non-optimal performance. To address this issue, many times a system will provide a tuning voltage in a middle range to accommodate the majority of tuners manufactured. In addition, tuners that vary significantly from a given performance curve may be sorted and removed. The real time feedback loop based on signal strength overcomes these inconsistencies and optimizes overall performance of the electronic tuner.

Further objects, features and advantages of this invention will become readily apparent to persons skilled in the art after a review of the following description, with reference to the drawings and claims that are appended to and form a part of this specification.

DETAILED DESCRIPTION

Figure 1:
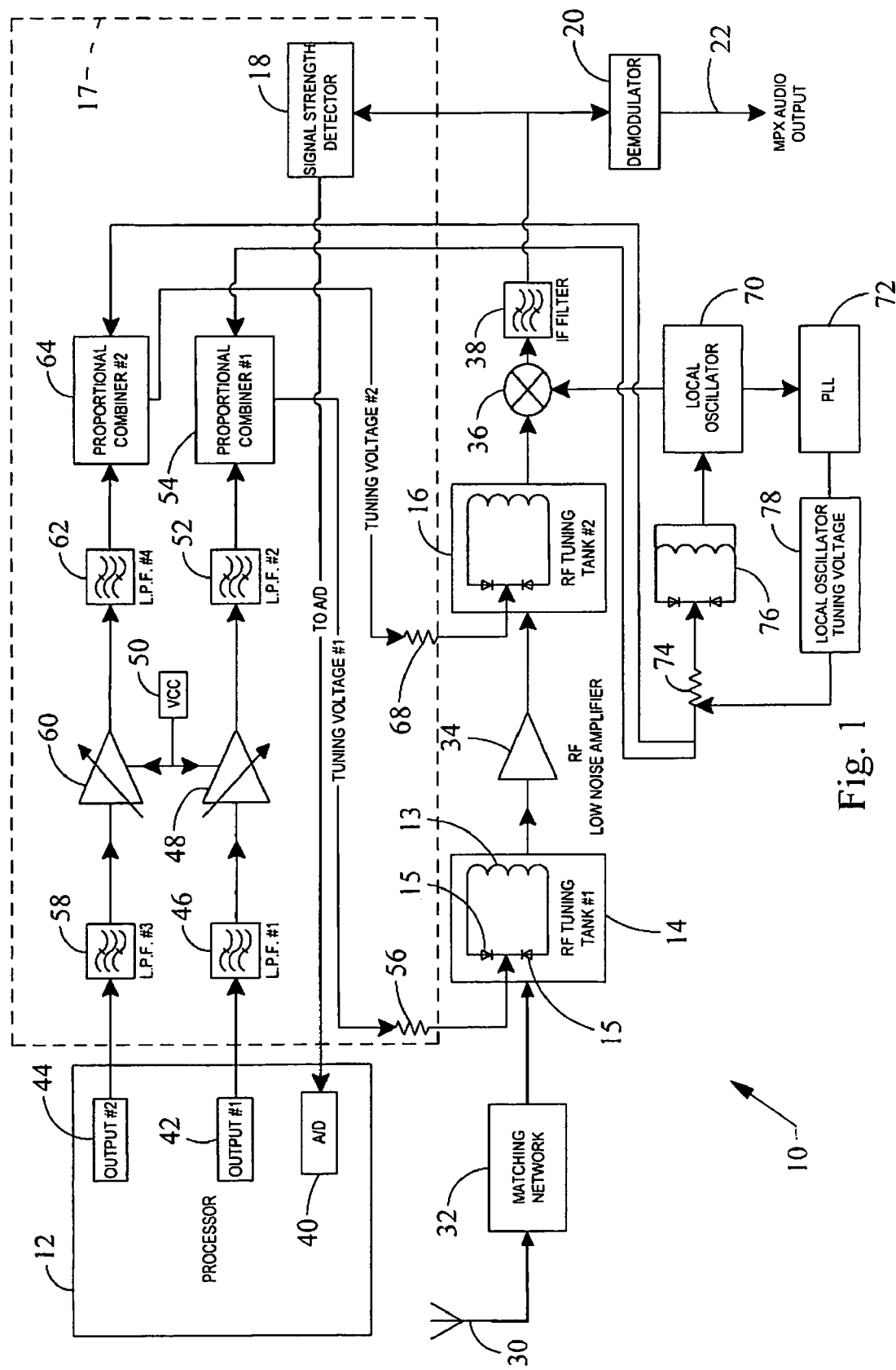
FIG. 1 is a schematic view of a system for generating a tuning voltage utilizing a dual tuning voltage output.

Referring now to FIG. 1, a system generally embodying the principles of the present invention is illustrated therein and designated at 10. As its primary components, the system 10 includes a processor 12, a tank circuit (RF tuning tank #1) 14, and a feedback loop 17.

Accordingly, a radio signal is received an through antenna 30 and provided to a matching network 32 that is matched to the impedance of the antenna 30 to optimize power transfer to the tuner circuit. The radio signal is provided from the matching network 32 to the tank circuit 14. The tank circuit 14 defines a selectivity frequency band based on the inductance and capacitance of the tank circuit 14. For example, the tank circuit 14 may include varactors 15 in a parallel electrical configuration with an inductor 13. The capacitance of the varactors 15 change based on the tuning voltage supplied to the varactors 15. To increase the amplitude of the radio signal, the tank circuit 14 then provides the radio signal to an RF low noise amplifier 34. The low noise amplifier 34 provides the radio signal to a second tank circuit (RF tuning tank #2) 16. The second tank circuit 16 defines a second selectivity frequency band that further narrows the frequency band in the radio signal. The second tuning tank 16 provides the radio signal to a mixer 36, and the mixer 36 combines the radio signal with a local oscillator signal, from a local oscillator circuit 70, to generate an intermediate frequency (IF) signal. From the mixer 36, the intermediate frequency signal is Provided to an IF filter 38. The filter 38 provides the intermediate frequency signal to both the signal strength detector 18 and the demodulator 20. The signal strength detector 18 generates an analog signal that corresponds to the signal strength of the radio signal. To form the feedback loop 17, the signal strength detector 18 provides the analog signal to an analog to digital (A/D) converter 40 of the processor 12. Meanwhile, the demodulator 20 converts the intermediate frequency signal into an analog audio output signal 22. The processor 12 analyzes analog signal utilizing the internal analog to digital converter 40.

The system 10 utilizes analog tuning voltages for adjustment of the system's tank circuits 14, 16. Conventional facilities in the processor 12 may be used for generating the tuning voltage. For example, a pulse width modulated control signal may be generated by the processor 12 and used to tune the tank circuits 14, 16.

The feedback loop 17 is accomplished by measuring the radio signal strength through the processor's internal analog to digital converter 40. The measurement is compared with calibration values that are determined for each tank circuit 14, 16 during the manufacturing process. The processor 12 varies the duty cycle of the control signal to fine tune the desired voltage needed for each particular tank circuit 14, 16. Once the desired voltage is reached, the duty cycle of the pulse width modulated control signal may remain constant until a need for readjusting the voltage arises.

Based on the analysis, the processor 12 controls a first output (output #1) 42 and a second output (output #2) 44 to generate the tuning voltages. Utilizing the analog signal from the signal strength detector 18, the processor 12 inherently controls the tuning voltages based on the radio signal strength. The first output 42 provides a first control signal to a low pass filter (L.P.F. #1) 46. In one embodiment, the first output 42 is a pulse width modulator and the first control signal is a pulse width modulated control signal, where the duty cycle of the control signal is manipulated to adjust the tuning voltages. The low pass filter 46 removes high frequency components from the tuning voltage. The first control signal is provided from the low pass filter 46 to an amplifier 48 that increases the amplitude of the first control signal according to a reference voltage (VCC) 50. To again remove any high frequency components from the first control signal, the first tuning voltage is then provided to another low pass filter (L.P.F. #2) 52. From the low pass filter 52, the first control signal is provided to a proportional combiner (proportional combiner #1) 54. The proportional combiner 54 combines the first control signal with a local oscillator tuning voltage signal from a local oscillator tuning voltage circuit 78. The combination results in a first tuning voltage signal that is provided through a load 56 to the first tank circuit 14.

Similarly, the second output (output #2) 44 may also be a pulse width modulator. In addition, the second output 44 provides a second control signal to a low pass filter (L.P.F. #3) 58. The second control signal is provided from the low pass filter 58 to an amplifier 60. The amplifier 60 increases the amplitude of the second control signal based on the reference voltage 50 and provides the second control signal to the low pass filter (L.P.F. #4) 62. The second control signal is provided from the low pass filter 62 to the proportional combiner (proportional combiner #2) 64 where it is combined with the local oscillator tuning voltage signal from the local oscillator tuning voltage circuit 78. A second tuning voltage signal, resulting from the combination, is provided from the proportional combiner 64 through a load 68 to the second tuning tank 16. Accordingly, the first and second tank circuit 14 and 16 function cooperatively to provide a more precise selectivity band for the tuning circuit. As will be appreciated by those skilled in the art, any number of tank circuits may be provided in series in a similar manner to further narrow the bandwidth to increase selectivity.

As noted above, the mixer 36 is in communication with the local oscillator circuit 70. A local oscillator signal is provided from the local oscillator circuit 70 to the mixer 36 to mix the local oscillator signal with a radio signal from the second tuning tank 16. Additionally, a signal from the local oscillator circuit 70 is provided to the phase lock loop (PLL) 72. The phase lock loop 72 provides an error signal to the local oscillator tuning voltage circuit 78, which generates the local oscillator tuning voltage signal that is provided to the first and second proportional combiners 54 and 64. In addition, the local oscillation tuning voltage signal is provided to a third tank circuit 76 through a load 74. The third tank circuit 76 is configured to select the frequency of the oscillation signal. Accordingly, the output of the third tank circuit 76 is provided to the local oscillator circuit 70.

Figure 2:
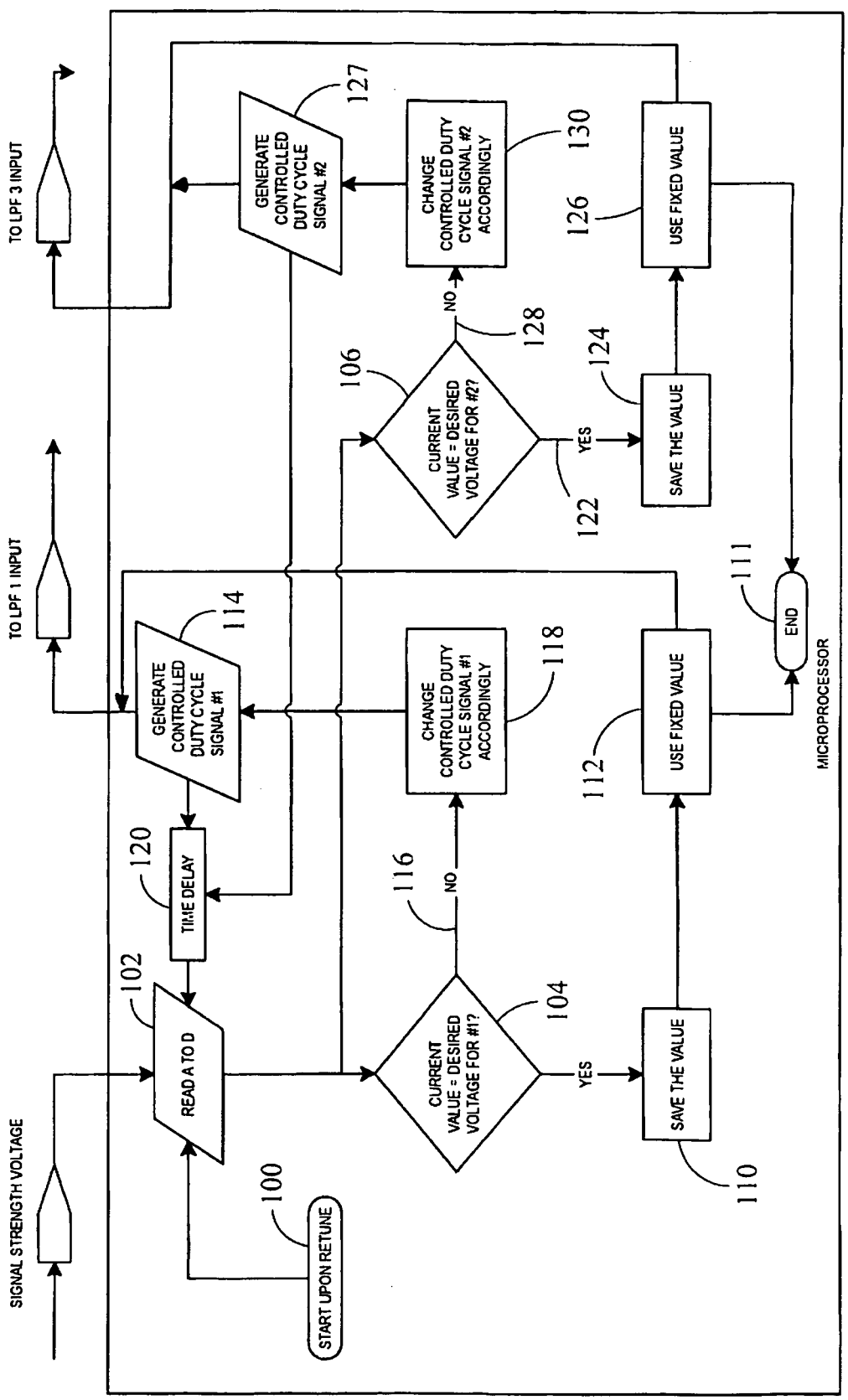
FIG. 2 is a block diagram of a technique for controlling a processor utilizing the dual tuning voltage output.

Now referring to FIG. 2, a method for generating tuning voltage signals is provided. The method starts in block 100 upon retuning of the system. In block 102, the processor reads the analog to digital converter to generate a measurement value indicative of the signal strength voltage. The measurement is provided to both blocks 104 and 106.

In block 104, the processor determines if the measured value is equal to the desired voltage for a first tank circuit at the given frequency. Accordingly, the processor may include a memory having a lookup table that is indicative of the optimal tuning voltage for the tank circuit at the given frequency. If the measured value equals the desired voltage for the first tank circuit, the method follows line 108 and the value is saved to memory block 110. In block 112, the processor uses the fixed value that was saved in block 110 to generate a controlled duty cycle tuning voltage signal that is provided to the first tank circuit 14. In block 111, the method then ends for the first tuning circuit until retuning is required.

In block 104, if the measured value does not equal the desired voltage for the first tank circuit 14, the logic follows line 116 to block 118. In block 118, the processor 12 calculates a change in the control duty cycle signal, which is calculated to reduce the error between the measured value and the desired voltage for the first tank circuit 14 at the given frequency. The information from block 118 is provided to block 114 where the control duty cycle tuning voltage signal is provided to the first tank circuit 14. Again, after the time delay 120, the processor 12 reads analog to digital converter and the feedback loop continues.

In block 106, the processor determines if the measured value is equal to the desired voltage for a second tank circuit 16 at the given frequency. Accordingly, the processor may include a memory having a lookup table that is indicative of the optimal tuning voltage for the second tank circuit 16 at the given frequency. If the measured value equals the desired voltage for the second tank circuit 16, the method follows line 122 and the value is saved to memory in block 124. In block 126, the processor 12 uses the fixed value that was saved in block 124 to generate a controlled-duty cycle tuning voltage signal that is provided to the second tank circuit 16. In block 111, the method for the second tank circuit then ends until retuning is required.

In block 106, if the measured value does not equal the desired voltage for the second tank circuit 16, the logic follows line 128 to block 130. In block 130, the processor 12 calculates a change in the control duty cycle signal calculated to reduce the error between the measured value and the desired voltage for the second tank circuit 16 at the given frequency. The information from block 130 is provided to block 127 where the control duty cycle tuning voltage signal is provided to the second tank circuit 16. After the time delay 120, the processor 12 again reads the analog to digital converter in box 102 and the feedback loop continues.

Figure 3:
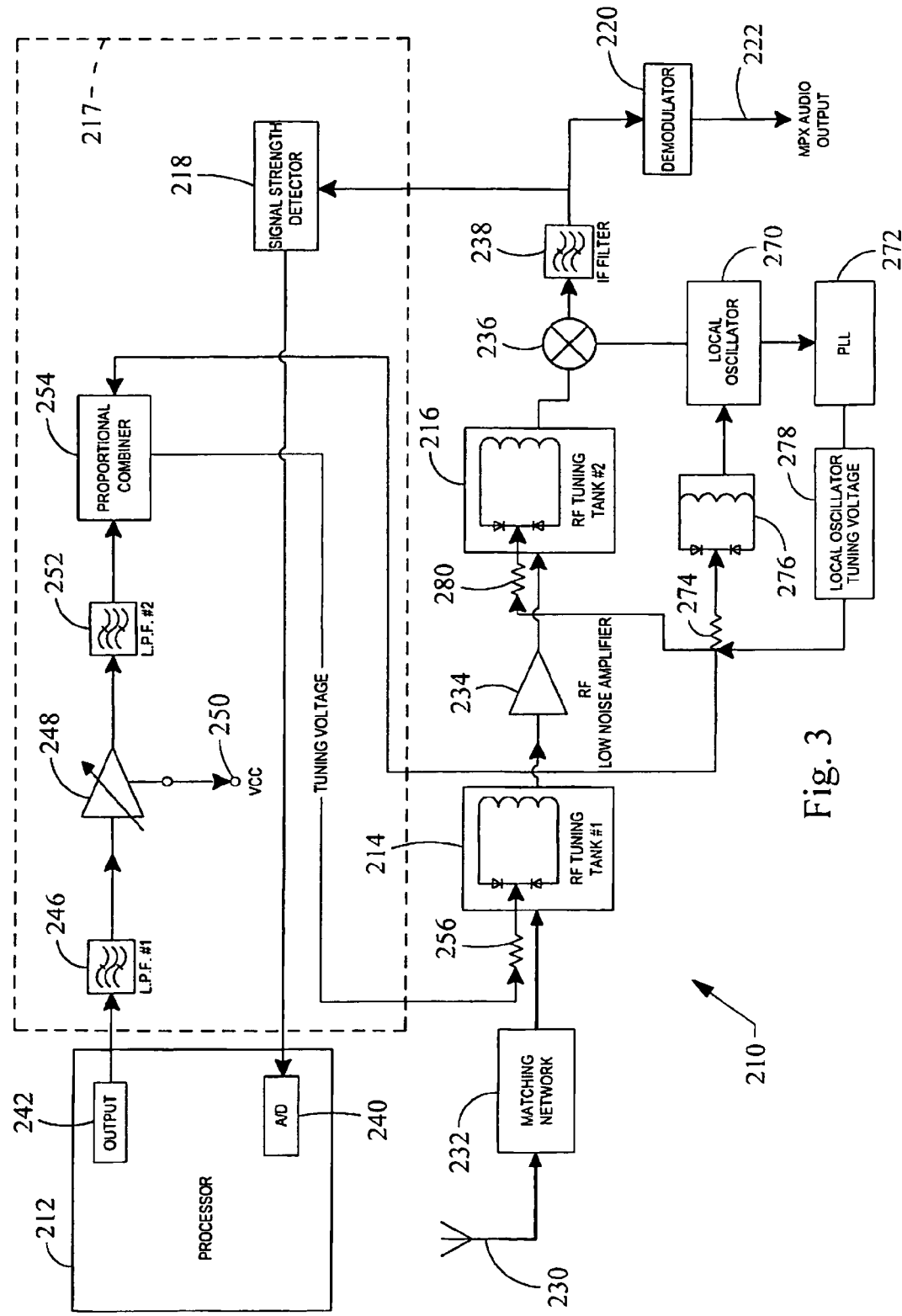
FIG. 3 is a schematic view of a system for creating a tuning voltage utilizing a single tuning voltage output.

Now referring to FIG. 3, a system 210 utilizing a single output technique is provided. As schematically illustrated therein, a radio transmission signal is received through antenna 230 and provided to a matching network 232 that is matched to the impedance of the antenna 230 to optimize power transfer to the tuner circuit. The radio signal is provided from the matching network 232 to a first tank circuit (RF tuning tank #1) 214. The tank circuit 214 defines a selectivity frequency band based on the inductance and capacitance of the tank circuit 214. To increase the amplitude of the radio signal, the tank circuit 214 then provides the radio signal to a (RF) low noise amplifier 234. The low noise amplifier 234 provides the radio signal to a second tank circuit (RF tuning tank #2) 216, which defines a second selectivity frequency band that further narrows the frequency band in the radio signal. The second tuning tank 216 provides the radio signal to a mixer 236. The mixer 236 combines the radio signal with a local oscillator signal, from a local oscillator circuit 270, to generate an intermediate frequency signal. From the mixer 236, the intermediate frequency signal is provided to a filter 238. The filter 238 provides the intermediate frequency signal to both the signal strength detector 218 and the demodulator 220. The signal strength detector 218 generates an analog signal that corresponds to the signal strength of the radio signal. To form a feedback loop 217, the signal strength detector 218 provides the analog signal to an analog to digital converter 240 in the processor 212. Meanwhile, the demodulator 220 converts the intermediate frequency signal into an analog audio output signal 222.

The processor 212 analyzes analog signal utilizing the internal analog to digital (A/D) converter 240. Based on the analysis, the processor 212 controls an output 242 to generate a tuning voltage. Accordingly, the processor 212 inherently controls the tuning voltage based on the radio signal strength from the signal strength detector 218. The output 242 provides a control signal to a low pass filter (L.P.F. #1) 246. In one embodiment, the output 242 is a pulse width modulator and the control signal is a pulse width modulated control signal, where the duty cycle of the control signal is manipulated to adjust the tuning voltage. The low pass filter 246 removes high frequency components from the tuning voltage. The control signal is provided from the low pass filter 246 to an amplifier 248 that increases the amplitude of the control signal according to a reference voltage (VCC) 250. To again remove any high frequency components from the control signal, the tuning voltage is then provided to another low pass filter (L.P.F. #2) 252. The control signal is provided from the low pass filter 252 to a proportional combiner 254, and the proportional combiner 254 combines the control signal with a local oscillator tuning voltage signal from a local oscillator tuning voltage circuit 278. The combination results in a tuning voltage signal that is provided through a load 256 to the first tank circuit 214.

As in the prior embodiment, the mixer 236 is in communication with a local oscillator circuit 270. The local oscillator signal is provided from the local oscillator circuit 270 to the mixer 236 to combine the local oscillator signal with a radio signal from the second tuning tank 216. Further, a signal from the local oscillator circuit 270 is also provided to a phase lock loop (PLL) 272. The phase lock loop 272 provides an error signal to the local oscillator tuning voltage circuit 278. The local oscillator tuning voltage circuit 278 generates the local oscillator tuning voltage signal that is provided to the proportional combiner 254 and the second tuning tank 216. In addition, the local oscillator tuning voltage signal is provided to a third tank circuit 276 through a load 274. The third tank circuit 276 is configured to select the frequency of the oscillation signal. Accordingly, the output of the third tank circuit 276 is provided to the local oscillator circuit 270.

Figure 4:
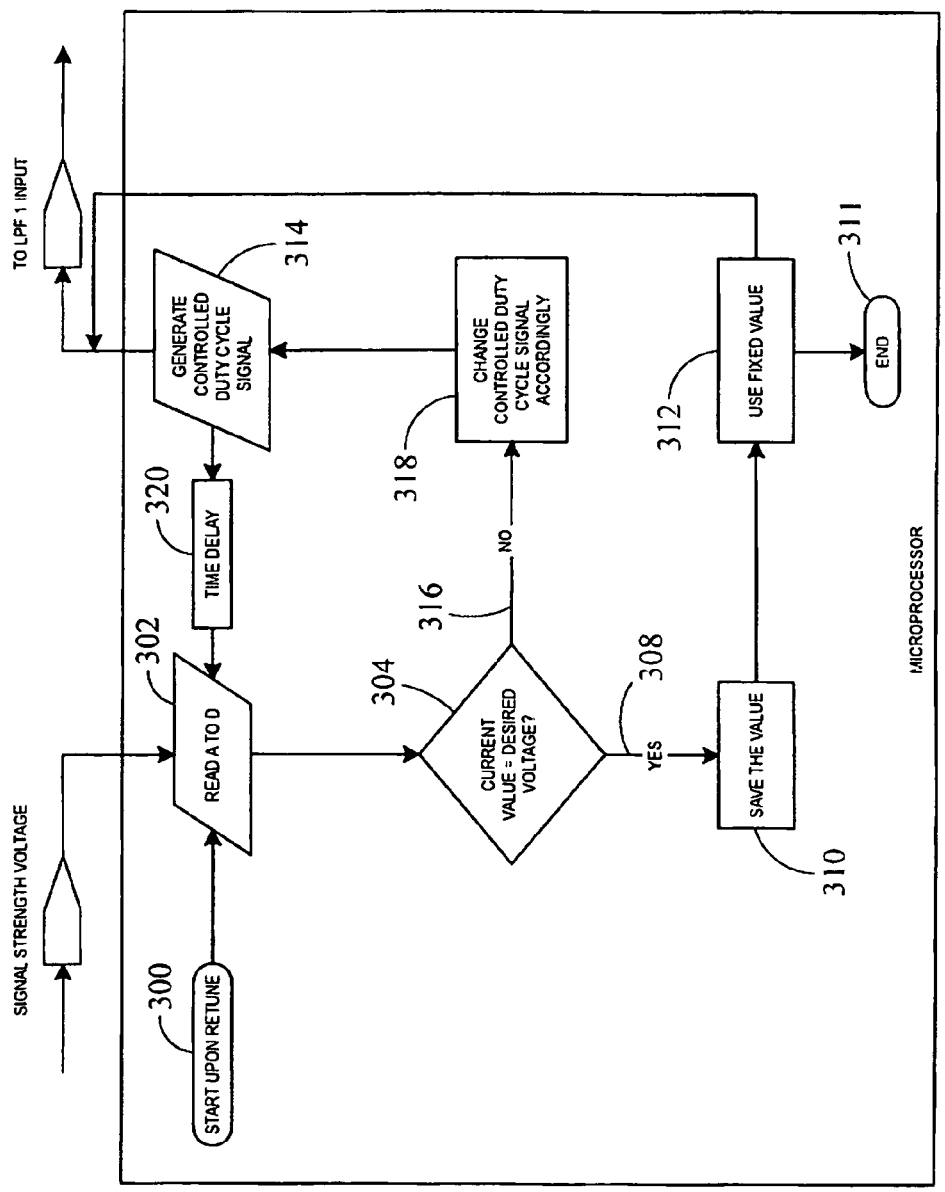
FIG. 4 is a block diagram of a technique for controlling a processor utilizing a single tuning voltage output.

Referring to FIG. 4, a method for generating tuning voltage signals with a signal is provided. The method starts in block 300 upon retuning of the system. In block 302, the processor 212 reads the analog to digital converter 240 to generate a measurement value indicative of the signal strength voltage. The measurement is provided to block 304.

In block 304, the processor 212 determines if the measured value is equal to the desired voltage for a first tank circuit 214 at the given frequency. Accordingly, the processor 212 may include a memory having a lookup table that is indicative of the optimal tuning voltage for the tank circuit 214 at the given frequency. If the measured value equals the desired voltage for the first tank circuit 214, the method follows line 308 and the value is saved to memory in block 310. In block 312, the processor 212 uses the fixed value that was saved in block 310 to generate a controlled duty cycle tuning voltage signal that is provided to the first tank circuit 214. The method then ends in block 311 until retuning is required.

In block 304, if the measured value does not equal the desired voltage for the first tank circuit 214, the logic follows line 316 to block 318. In block 318, the processor 212 calculates a change in the control duty cycle signal calculated to reduce the error between the measured value and the desired voltage for the first tank circuit 214 at the given frequency. The information from block 318 is provided to block 314 where the control duty cycle tuning voltage signal is provided to the first tank circuit 214. Again, after a time delay 320, the processor 212 reads analog to digital converter 240 and the feedback loop 217 continues.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:

1. A system for generating a tuning voltage for a tuner circuit, the system comprising:
   at least one tank circuit configured to receive a radio signal;
   a signal strength detector in communication with the at least one tank circuit to generate a strength signal that corresponds to a radio signal strength;
   a processor in communication with the signal strength detector to receive the strength signal forming a feedback loop, the processor having an output based on the signal strength and the feedback loop configured to generate a tuning voltage signal based on the output, the tuning voltage signal being provided to the at least one tank circuit, the output being in electrical series communication with a proportional combiner, wherein the proportional combiner is configured to combine a pulse width modulated signal from the output and a local oscillator tuning voltage signal to generate the tuning voltage signal that is provided to the at least one tank circuit.

2. The system according to claim 1, wherein the strength signal is an analog signal.

3. The system according to claim 2, wherein the processor includes an analog to digital converter configured to receive the strength signal.

4. The system according to claim 1, wherein the output is a pulse width modulator.

5. The system according to claim 1, wherein the processor is configured to provide more than one output to the feedback loop.

6. A system for generating a tuning voltage for a tuner circuit, the system comprising:
   at least one tank circuit configured to receive a radio signal;
   a signal strength detector in communication with the at least one tank circuit to generate a strength signal that corresponds to a radio signal strength;
   a processor in communication with the signal strength detector to receive the strength signal forming a feedback loop, the processor having an output based on the signal strength and the feedback loop configured to generate a tuning voltage signal based on the output, the tuning voltage signal being provided to the at least one tank circuit; and
   a mixer in communication with the at least one tank circuit to receive the radio signal and combine the radio signal with a local oscillator signal to generate an intermediate frequency signal, the intermediate frequency signal being provided to a demodulator to generate an analog audio output signal, wherein the mixer is in communication with the signal strength detector to generate the strength signal.

7. A system for generating a tuning voltage for a tuner circuit, the system comprising:
a first tank circuit configured to receive a radio signal;
a second tank circuit in electrical series connection with the first tank circuit;
a signal strength detector in communication with the second tank circuit to generate a strength signal that corresponds to a radio signal strength;
a processor in communication with the signal strength detector to receive the strength signal and the processor having a first output to generate a first tuning voltage signal and a second output to generate a second tuning voltage signal based on the strength signal, the first tuning voltage signal being provided to the first tank circuit and the second tuning voltage signal being provided to the second tank circuit for compensating tank circuit variation.

8. The system according to claim 7, wherein the strength signal is an analog signal.

9. The system according to claim 8, wherein the processor includes an analog to digital converter configured to receive the strength signal.

10. The system according to claim 9, wherein the first output is a pulse width modulator.

11. The system according to claim 10, wherein the first output is in electrical series communication with a first proportional combiner.

12. The system according to claim 11, wherein the first proportional combiner is configured to combine a pulse width modulated signal from the first output and a local oscillator tuning voltage to generate the tuning voltage signal that is provided to the first tank circuit.

13. The system according to claim 12, wherein the second output is in electrical series communication with a second proportional combiner.

14. The system according to claim 13, wherein the second proportional combiner is configured to combine a pulse width modulated signal from the second output and a local oscillator tuning voltage to generate the tuning voltage signal that is provided to the second tank circuit.

15. The system according to claim 14, further comprising a mixer in communication with the second tank circuit to receive the radio signal and combine the radio signal with a local oscillator signal to generate an intermediate frequency signal.

16. The system according to claim 15, wherein the intermediate frequency signal is provided to a demodulator to generate an analog audio output signal.

17. The system according to claim 16, wherein the mixer is in communication with the signal strength detector to generate the strength signal.

* * * * *